United States Patent [19]
Ovens

[11] Patent Number: 4,845,387
[45] Date of Patent: Jul. 4, 1989

[54] NON-STACKED ECL TYPE AND FUNCTION

[75] Inventor: Kevin M. Ovens, Garland, Tex.

[73] Assignee: Texas Instruments Incorporated, Dallas, Tex.

[21] Appl. No.: 55,491

[22] Filed: May 28, 1987

[51] Int. Cl.[4] .......................................... H03K 19/084
[52] U.S. Cl. .................................... 307/455; 307/443; 307/458; 307/475; 307/565; 357/15
[58] Field of Search ................ 307/443, 475, 454–458, 307/557–559, 561, 565, 270, 217 A; 357/15, 67, 71, 62

[56] References Cited

U.S. PATENT DOCUMENTS

| | | | |
|---|---|---|---|
| 4,112,314 | 9/1978 | Gani et al. | 307/455 X |
| 4,518,876 | 5/1985 | Constantinescu | 307/455 X |
| 4,529,894 | 7/1985 | Chan et al. | 307/455 X |
| 4,575,647 | 3/1986 | Ashton et al. | 307/443 |
| 4,636,990 | 1/1987 | Buscaglia et al. | 307/455 X |
| 4,680,480 | 7/1987 | Hopta | 307/270 |
| 4,686,395 | 8/1987 | Sato et al. | 307/455 |

FOREIGN PATENT DOCUMENTS

0051621 3/1983 Japan ................................... 307/455

OTHER PUBLICATIONS

Chang et al., "Complementary Driver for Emitter-Coupled-Logic Gates", IBM T.D.B., vol. 19, No. 12, May 1977, pp. 4614–4615.

Primary Examiner—David Hudspeth
Attorney, Agent, or Firm—George L. Craig; James T. Comfort; Melvin Sharp

[57] ABSTRACT

A logic circuit which includes first and second differentially connected amplifying devices having first and second complementary output voltage nodes. Means for limiting the output voltage swing of the devices at the output nodes to a predetermined range reduces the required voltage supply source. A reference voltage is coupled to the second amplifying device while a plurality of input diodes are coupled in parallel to an input of the first amplifying device to form AND inputs thereto. A biasing element is coupled to the input of the first amplifying device.

23 Claims, 3 Drawing Sheets

4,845,387

NON-STACKED ECL TYPE AND FUNCTION

BACKGROUND OF THE INVENTION

The present invention relates to a AND circuit for use in an emitter coupled logic system which avoids the use of transistor stacking.

Emitter coupled logic is a type of logic in which transistors are operated either in an active or in an OFF region and current is 'steered' rather than having voltages or levels passed around. Speed is the primary purpose for using ECL logic. Typically, ECL circuitry operates off of a negative supply voltage of about $-5.2$ volts and might operate between input logic levels of $-1.55$ volts and $-0.75$ volts. In designing an AND function with such a circuit stacked logic is used. Since each section of a stack requires an additional $-0.8$ volts towards $V_{EE}$, the maximum number of inputs for such an AND circuit is 3.

Schottky current mode logic (SCML) which operates with a $-2.0$ volt supply places even more severe constraints on a stacked AND gate system. In the latter case stacked gates cannot be used since there is not enough voltage available.

Accordingly, it is an object of the present invention to provide a circuit operating on a low supply voltage which can incorporate a plurality of AND type inputs.

SUMMARY OF THE INVENTION

According to the invention there is provided an electrical circuit having a plurality of AND gate inputs which includes a differentially connected first and second amplifying element, a reference voltage source coupled to the second amplifying device, and means for limiting the voltage swing at the output of each amplifying device. A plurality of input diodes are coupled in parallel to an input of the first amplifying device forming AND inputs thereto and biasing means is coupled to the input of the first amplifying device.

Preferably, the first and second amplifying devices are bipolar transistors the second of which has a collector load formed of a first diode coupled from high voltage source to the collector of the second transistor. An OR output can be provided by a dropping resistor from the high voltage source to an OR node and a second diode of a smaller forward drop than the first diode from the OR node to the collector of the second transistor. Thus, the OR node is level shifted from the voltage level of the collector of the second transistor to correspond with the required input for a subsequent OR/NOR input stage. With the foregoing circuit, an AND function can be formed with a 2 volt supply.

BRIEF DESCRIPTION OF THE DRAWING

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
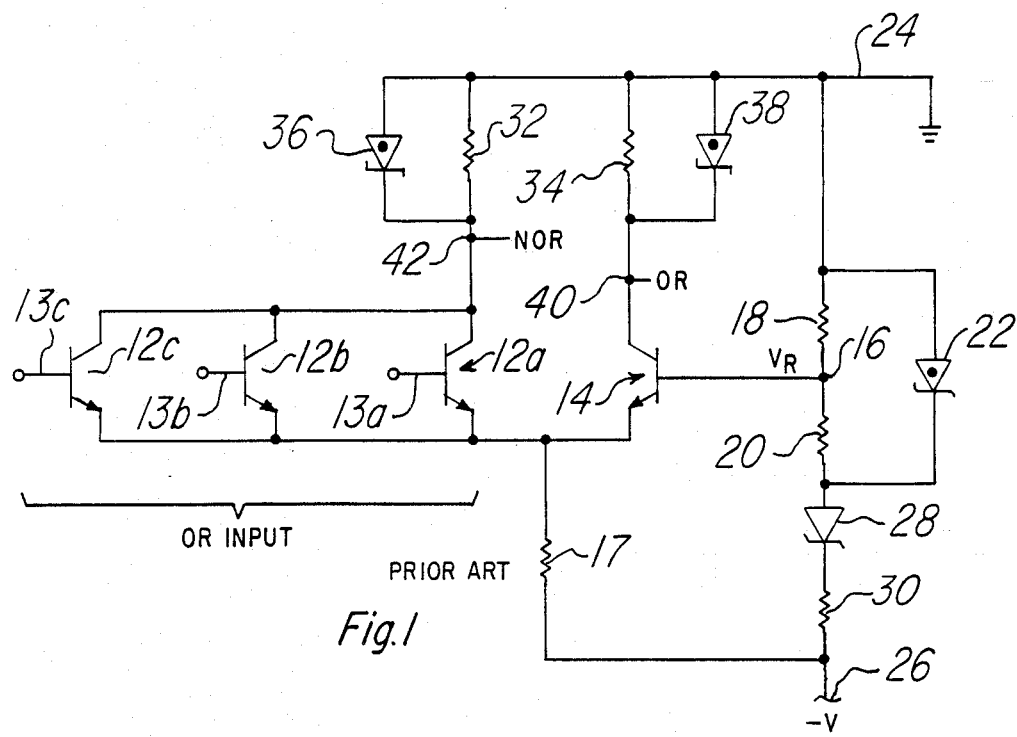
FIG. 1 is a schematic diagram of a typical Schottky current mode logic (SCML) gate having OR inputs.

Referring to FIG. 1 there is shown a typical Schottky current mode logic (SCML) circuit having first parallel connected transistors 12a, 12b, and 12c differently connected with a second transistor 14 whose emitters are connected through resistor 16 to a negative supply voltage 26. The base of the second transistor 14 is connected to a reference voltage node 16 located at the junction of a pair of resistors 18 and 20. The voltage across the pair is set by a titanium tungsten Schottky diode 22 having a forward voltage drop from ground line 24 of approximately 0.3 volts. Typically, the reference voltage would be $-0.15$ volts. A platinum silicide Schottky diode 28 having a forward voltage drop of about 0.6 volts and resistor 30 couple the cathode of diode 22 to the negative supply 26.

Each of transistors 12a, 12b and 12c have a corresponding base input 13a, 13b, and 13c, respectively. The collectors of transistors 12a, 12b, and 12c are connected to ground line 24 through a resistor 32 in parallel with a titanium tungsten Schottky diode 36. Similarly, the collector of transistor 14 connects to ground line 24 through a resistor 34 in parallel with titanium tungsten diode 38. The line 42 from the collector of transistors 12a, 12b, and 12c provide a NOR output while line 40 from the collector of transistor 14 provides an OR output.

When any one of the bases of transistors 12a, 12b, and 12c is higher than the reference voltage on node 16, the corresponding transistor 12a, 12b, or 12c turns on providing sufficient current through resistor 16 to turn off transistor 14. Thus, collector 42 drops to $-0.3$ volts being the forward drop of diode 36 and the collector 40 rises to 0 volts. With all of the inputs of transistors 12a, 12b, and 12c low, transistors 12a, 12b, and 12c will be off while transistor 14 will be on. Thus, the output on line 42 will be 0 volts while that on line 40 will be $-0.3$ volts.

Figure 2:
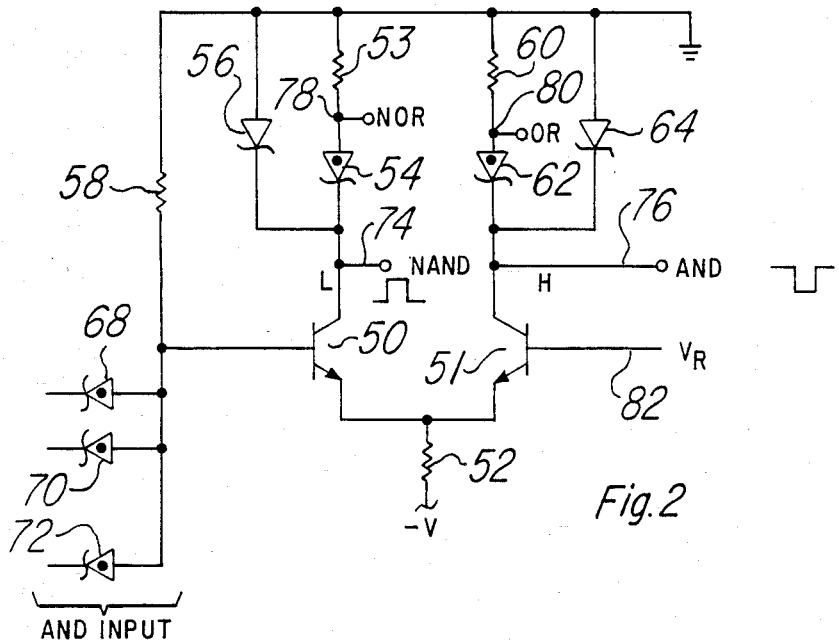
FIG. 2 is a schematic diagram of an SCML logic circuit incorporating AND inputs in accordance with a preferred embodiment of the invention.

The circuit of FIG. 2 shows how a circuit structure similar to that of FIG. 1 can be used as a non-stacked AND gate. In FIG. 2, transistors 50 and 51 are coupled differentially so that their emitters are connected in common through an emitter resistor 52 to a negative supply. The collector of transistor 50 is connected through a platinum silicide diode 56 to ground and through a titanium tungsten diode in series with a resistor 53 to ground in parallel with diode 56. Thus there are two output levels provided, a NOR output at the junction of diode 54 and resistor 53 and a NAND output at the collector 74 of transistor 50. Similarly, a platinum silicide diode 64 in parallel with a series connected resistor 60 and diode 62 connect collector 76 to ground. Junction 80 between resistor 60 and titanium tungsten diode 62 provide an OR output while the collector 76 of transistor 51 provides an AND output. Titanium tungsten diodes 68, 70 and 72 provide three AND inputs to the base of transistor 50 while resistor 58 provides bias to the base of transistor 50 to keep it on in the absence of input signals to diodes 68, 70, and 72.

With all of the inputs high diodes 68, 70 and 72 will be non-conducting and transistor 50 will be biased on by resistor 58. Thus, the collector 74 of transistor 50 will be at −0.6 volts and the collector 76 of transistor 51 will be at −0.3 volts. The leakage current through transistor 51 will be high enough to turn on diode 62 and establish a 0.3 voltage forward drop. With any of the inputs to diodes 68, 70 and 72 low, the base of transistor 50 will be pulled low turning off transistor 50 and turning on transistor 51. In the latter case collector 76 will be at −0.6 volts while collector 74 will be at −0.3 volts. Consequently, the circuit of FIG. 2 functions as an AND circuit when the output is taken from collector 76 and a NAND circuit when the output is taken from collector 74. Clearly, any number of diode inputs can be used without significantly affecting the circuit performance unlike the case where the inputs are fed through separate stacked transistors. The same circuit with parallel connected transistors as shown in FIG. 1 can provide the correct voltage levels for driving OR/NOR gates from junctions 80 and 78, respectively.

While diodes 68, 70, 72, 54 and 62 are titanium tungsten and the remaining ones platinum silicide, in practice other diodes of different metal types can be used depending on circuit voltage levels and swings required. The only requirement for the operation of the circuit exemplified in FIG. 2 is that the forward voltage drop of the high voltage drop diodes 56 and 64 is approximately equal to the logic voltage swing plus the forward voltage drop of the low voltage drop diodes 54, 62, 68, 70 and 72.

Figure 3:
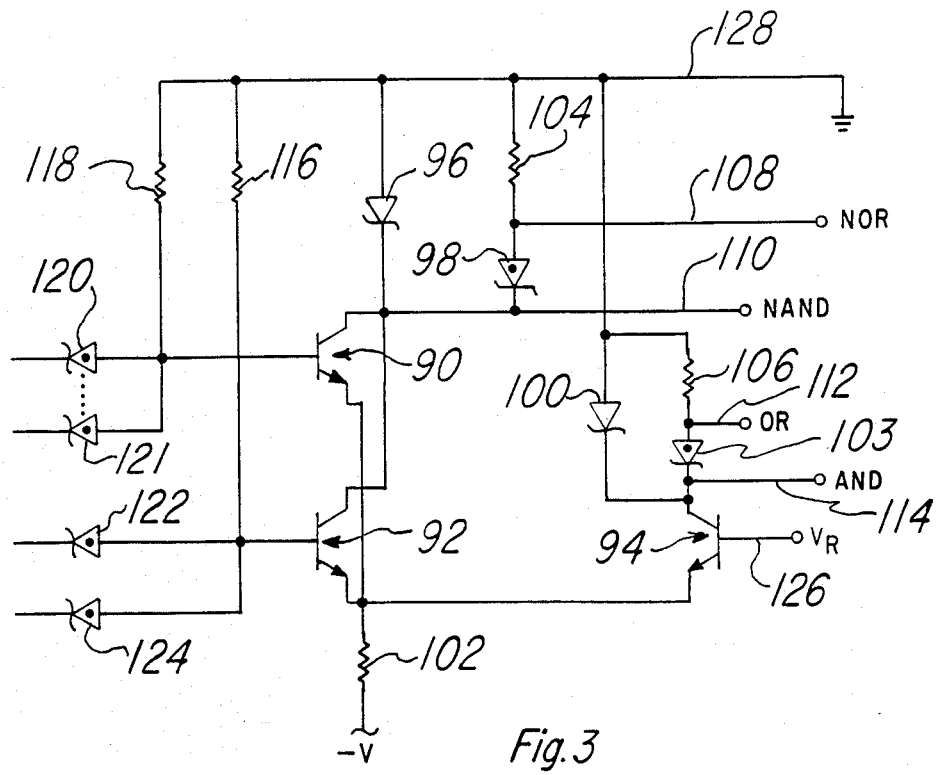
FIG. 3 is a schematic diagram of an SCML logic circuit combining both AND and OR input functions.

The circuit of FIG. 3 shows how both an AND and an OR function can be combined into one circuit. In this case, transistors 90 and 92 are in parallel and differentially connected to transistor 94. The resistor 102 is connected at one end to the emitters of all of the latter transistors and at the other end to a negative voltage supply which is typically −2 volts for SCML. As in FIG. 2, the collector of transistor 94 is coupled to the ground line through platinum silicide diode 100 in parallel with the latter through titanium tungsten diode 103 in series with resistor 106. The collector of transistors 90 and 92 connect to ground line 128 through platinum silicide diode 96 and through titanium tungsten diode 98 in series with resistor 104. The base of transistor 90 is biased on through resistor 118 while that of transistor 92 is biased on through resistor 116. Diodes 120 and 121 form AND inputs to transistor 90 while diodes 122 and 124 form AND inputs to transistor 92. The set of inputs to transistor 90 and those of transistor 92 form an OR function in that either the inputs to diodes 120 and 121 can both be high or those of diodes 122 and 124 can both be high to give a high output on line 114.

Level shifting of the outputs at lines 108 and 112 provide the correct voltage range for OR/NR outputs for those lines (0 to −0.3 volts). AN AND/NAND level output can be taken along line 110 and 114.

Figure 4:
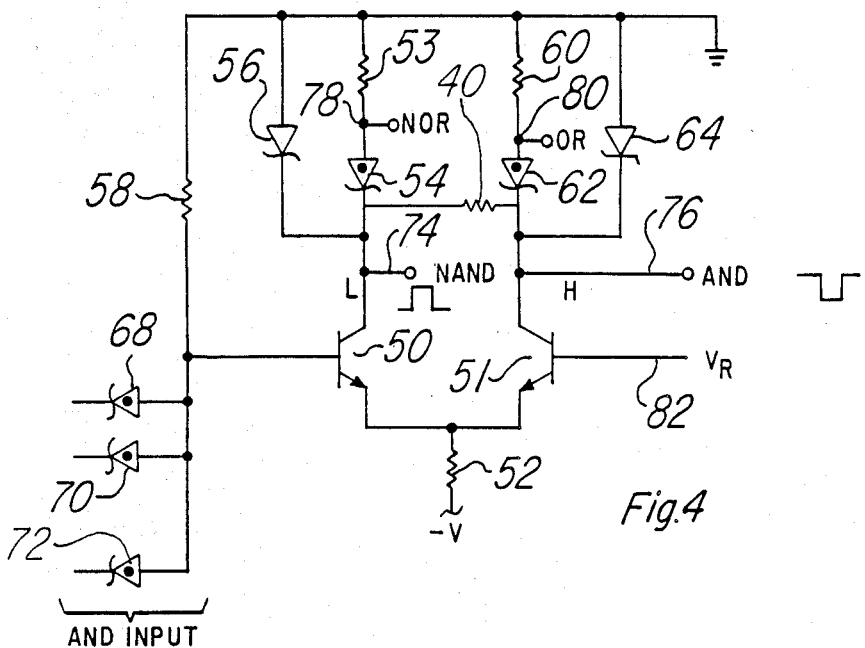
FIG. 4 is a schematic diagram of a variant of the circuit of FIG. 2 with stabilizing resistor added.
Figure 5:
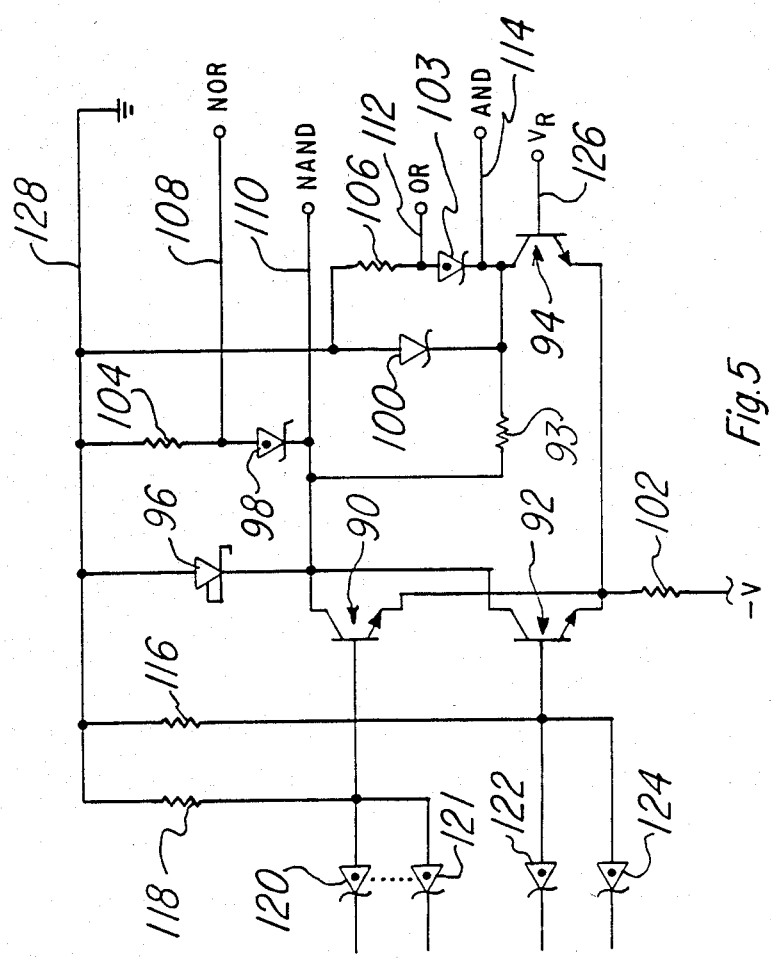
FIG. 5 is a schematic diagram of a variant of the circuit of FIG. 3 with a resistor added to the collectors of the differential pair of output tranistors.

A variant of the circuit of FIG. 2 is shown in FIG. 4 in which like reference numbers refer to like components. The circuit of FIG. 4 is identical to that of FIG. 2 except that FIG. 4 includes a resistor 90 from the collector of transistor 50 to that of transistor 51. Resistor 90 stabilizes the AND/NAND high voltage level so that the voltage level is less dependent on leakage characteristics. Resistor 90 also speeds up the high-to-low transition about 20% in most cases. It is also possible to further improve the circuit of FIG. 2 by substituting for resistor 52 a current source. The corresponding change to the circuit of FIG. 3 is as shown in FIG. 5. In this case resistor 93 is added between the collector of transistor 90 and the collector of transistor 94.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A logic circuit comprising:
    first and second differentially connected transistors having first and second complementary output nodes at respective first and second collectors;
    means for limiting the output voltage swing of at least one of said collectors to a predetermined range, said limiting means coupled between ground potential and said at least one collector;
    a reference voltage coupled to an input of said second transistor;
    a supply voltage coupled to respective first and second emitters of said transistors;
    a plurality of input diodes having anodes commonly coupled to an input of said first transistor forming AND inputs thereto; and
    biasing means coupled to the input of said first transistor.

2. A circuit according to claim 1, wherein said output voltage swing limiting means includes a first diode having a high forward bias voltage.

3. A circuit according to claim 2, wherein each said output voltage swing limiting means further includes a resistor in series with level shifting means, said resistor and said level shifting means parallel connected with said first diode.

4. A circuit according to claim 3, wherein said level shifting means is a second diode having a low forward bias voltage.

5. A circuit according to claim 4, wherein said biasing means is a resistor coupled between said ground potential and the base of said first transistor.

6. A circuit according to claim 5, further including a resistor connected between the collectors of said transistors.

7. A circuit according to claim 4, wherein said diodes having a high forward bias voltage and said diodes having a low forward bias voltage are Schottky diodes.

8. A circuit according to claim 7, wherein said diodes having a low forward bias voltage are titanium tungsten Schottky diodes and said diodes having a high forward bias are platinum silicide Schottky diodes.

9. A logic circuit comprising:
    first and second differentially connected transistors having commonly connected emitters coupled to a low voltage supply line;
    a first diode having a high forward bias voltage parallel connected with a series connected second diode and first resistor, said second diode having a low forward bias voltage, the first diode, second diode and first resistor coupled between a high voltage supply line and a collector of one of said first or second transistors for establishing a predetermined voltage drop from said high voltage line to said collector;

a reference voltage having a voltage intermediate said high voltage and low voltage supply coupled to a base of said second transistor;
a plurality of input diodes having a low forward bias voltage and having their anodes commonly coupled to a base of said first transistor, signals transmitted by said input diodes forming AND inputs to said base of said first transistor; and
a biasing means coupled between the base of said first transistor and the high voltage supply line for biasing on said first transistor when the inputs to said input diodes are all high.

10. A circuit according to claim 9, including a second resistor connected between collectors of said first and second differentially connected transistors.

11. A circuit according to claim 9 wherein a third diode having a high forward bias voltage is coupled between the other collector of said first or second transistors and the thigh voltage supply line.

12. A circuit according to claim 11 further including a third resistor connected in series with a fourth diode having a low forward bias voltage, said third resistor and said fourth diode connected in parallel with said third diode.

13. A circuit according to claim 12, wherein all diodes are Schottky diodes.

14. A circuit according to claim 12, wherein all said diodes having a low forward bias voltage are titanium tungsten diodes.

15. A circuit according to claim 12, wherein all said diodes having a high forward bias voltage are platinum silicide diodes.

16. An emitter-coupled logic circuit combining AND and OR logic comprising
at least a first and a second transistor connected in parallel, said first and second transistors differentially connected to a third transistor, said first, second and third transistors having commonly connected emitters;
a resistor coupled between said emitters of said transistors and a low voltage supply source;
means for supplying input signals to a base of each of said first and second transistors;
means for biasing said first and second transistors coupled between said bases of said first and second transistors and a high voltage supply source;
a reference voltage source connected to a base of said third transistor;
first means for limiting the output voltage swing of commonly connected collectors of said first and second transistors coupled between said commonly connected collectors and said high voltage supply source; and
second means for limiting the output voltage swing of a collector of said third transistor coupled between said collector of said third transistor and said high voltage supply source.

17. A logic circuit as recited in claim 16 wherein said first means for limiting the output voltage swing includes a first diode having a high forward bias voltage parallel connected with a second resistor series connected to a second diode having a low forward bias voltage.

18. A logic circuit as recited in claim 16 wherein said second means for limiting the output voltage swing includes a third diode having a high forward bias voltage parallel connected with a third resistor series connected to a fourth diode having a low forward bias voltage.

19. A logic circuit as recited in claim 16 wherein said means for supplying input signals includes a plurality of input diodes for each of said bases of said first and second transistors.

20. A logic circuit as recited in claim 16 wherein said biasing means includes a bias resistor for each said base of said respective first and second transistors.

21. A logic circuit as recited in claim 17 wherein said first diode is a platinum silicide Schottky diode and said second diode is a titanium tungsten Schottky diode.

22. A logic circuit as recited in claim 18 wherein said third diode is a platinum silicide Schottky diode and said fourth diode is a titanium tungsten Schottky diode.

23. A logic circuit as recited in claim 16 including a stabilizing resistor coupled between said commonly connected collectors of said first and second transistors and said collector of said third transistor.

* * * * *